(12) United States Patent
Dzafic

(10) Patent No.: US 10,627,437 B2
(45) Date of Patent: Apr. 21, 2020

(54) METHOD OF ESTIMATING A SYSTEM VALUE

(71) Applicant: SIEMENS AKTIENGESELLSCHAFT, Munich (DE)

(72) Inventor: Izudin Dzafic, Sarajevo (BA)

(73) Assignee: Siemens Aktiengesellschaft, Munich (DE)

( * ) Notice: Subject to any disclaimer, the term of this patent is extended or adjusted under 35 U.S.C. 154(b) by 400 days.

(21) Appl. No.: 15/516,457

(22) PCT Filed: Oct. 2, 2014

(86) PCT No.: PCT/EP2014/071161
§ 371 (c)(1),
(2) Date: Apr. 3, 2017

(87) PCT Pub. No.: WO2016/050309
PCT Pub. Date: Apr. 7, 2016

(65) Prior Publication Data
US 2018/0231596 A1    Aug. 16, 2018

(51) Int. Cl.
*G01N 33/48*    (2006.01)
*G01R 31/02*    (2006.01)
*G05B 13/02*    (2006.01)
*G06F 17/11*    (2006.01)
*G06F 17/16*    (2006.01)

(52) U.S. Cl.
CPC ............ *G01R 31/02* (2013.01); *G05B 13/02* (2013.01); *G06F 17/11* (2013.01); *G06F 17/16* (2013.01)

(58) Field of Classification Search
CPC ......... G01R 31/02; G05B 13/02; G06F 17/11; G06F 17/16
USPC ..................................................... 702/52, 58
See application file for complete search history.

(56) References Cited

PUBLICATIONS

Schweppe et al., "Power system static-state estimation, Part I, II, III", IEEE Trans. Power Apparat. Syst., vol. PAS-89, No. 1, pp. 120-135, Jan. 1970.
Roytelman et al., "State estimation for electric power distribution systems in quasi real-time conditions," IEEE Trans. on Power Delivery, vol. 8, No. 4, pp. 2009-2015, Oct. 1993.
Lu et al., "Distribution system state estimation", IEEE Transactions on Power Systems, vol. 10, No. 1, pp. 229-240, Feb. 1995.
Hoffman et al., "Distribution State Estimation: A Fundamental Requirement for the Smart Grid", DistribuTECH (2010).
Dzafic et al., "Real-time Distribution System State Estimation," IPEC, 2010 Conference Proceedings, pp. 22-27, Oct. 2010.
Dzafic et al., "Real Time Estimation of Loads in Radial and Unsymmetrical Three-Phase Distribution Networks," IEEE Trans. on Power Systems, vol. 28, No. 4, pp. 4839-4848, Nov. 2013.

(Continued)

*Primary Examiner* — Toan M Le
*Assistant Examiner* — Xiuqin Sun
(74) *Attorney, Agent, or Firm* — Laurence Greenberg; Werner Temer; Ralph Locher

(57) ABSTRACT

A method estimates a system value which indicates a state of an electrical distribution system. The method includes the steps of measuring one or more electrical quantities at a plurality of system nodes and providing measurement values, and generating the system value based on the measurement values as well as on weighting coefficients that define or reflect the timely change rate of the measurement values and/or the transmission rate of the measurement values.

11 Claims, 9 Drawing Sheets

(56) References Cited

PUBLICATIONS

Bose, "Smart Transmission Grid Applications and Their Supporting Infrastructure," IEEE Trans. on Smart Grid, vol. 1, No. 1, pp. 11-19, Jun. 2010.
Mak et al., "Synchronizing SCADA and Smart Meters Operation for Advanced Smart Distribution Grid Applications", IEEE PES Innovative Smart Grid Technologies, 2012.
Gomez-Exposito, A Multilevel State Estimation Paradigm for Smart Grids, Proceedings of the IEEE, vol. 99, No. 6, pp. 952-976, Jun. 2011.
Gomez-Quiles et al., "State Estimation for Smart Distribution Substations," IEEE Trans. on Smart Grid, vol. 3, No. 2, pp. 986-995, Jun. 2012.
Samarakoon et al., "Use of Delayed Smart Meter Measurements for Distribution State Estimation", IEEE Power and Energy Society General Meeting, Jul. 2011.
Wu et al.,"A Robust State Estimator for Medium Voltage Distribution Networks", IEEE Trans. on Power Systems, vol. 28, No. 2, pp. 1008-1016, May 2013.
Abdel-Majeed et al., "Development of State Estimator for Low Voltage Networks using Smart Meters Measurement Data", Powertech 2013, Grenoble.
Feng et al., "A Practical Multi-Phase Distribution State Estimation Solution Incorporating Smart Meter and Sensor Data", IEE/PES General Meeting, San Diego 2012.
Carmona-Delgado et al.,"Fast and reliable distribution load and state estimator," Electric Power System Research, vol. 101, pp. 110-124, Aug. 2013.
Chow et al., "Two-time-scale feedback de-sign of a class of nonlinear systems," IEEE Trans. on Automatic Control, vol. 23, No. 3, pp. 438-443, Jun. 1978.
Khorasani et al., "Two time scale decomposition and stability analysis of power systems," IEE Proceedings D: Control Theory and Applications, vol. 135, No. 3, pp. 205-212, May 1988.
Hofmann et al., "Speed-sensorless vector torque control of induction machines using a two-time-scale approach," IEEE Trans. on Industry Applications, vol. 34, No. 1, pp. 169-177, Jan.-Feb. 1998.
Yin et al., "Continuous-time tracking algorithms involving two-time-scale Markov chains," IEEE Trans. on Signal Processing, vol. 53, No. 12, pp. 4442-4452, Dec. 2005.
Nagy-Kiss et al., "State estimation of two-time scale multiple models with unmeasurable premise variables. Application to biological reactors," 49th IEEE Conference on Decision and Control (CDC), pp. 5689-5694, Dec. 2010.
Singh et al., "Choice of estimator for distribution system state estimation", IET Gener. Transm. Distrib., vol. 3, No. 7, pp. 666-678, 2009.
Kansal et al. "Bandwidth and Latency Requirements for Smart Transmission Grid Applications," IEEE Trans. on Smart Grid, vol. 3 No. 3, pp. 1344-1351, Sep. 2012.
Gomez-Exposito et al.,"State Estimation in Two Time Scales for Smart Distribution Systems"; IEEE Transactions on Smart Grid, IEEE, vol. 6, No. 1, Jul. 24, 2014, pp. 421-430; XP011568454; ISSN: 1949-3053, DOI:10.1109/TSG.2014.2335611, 2014.

FIG 2
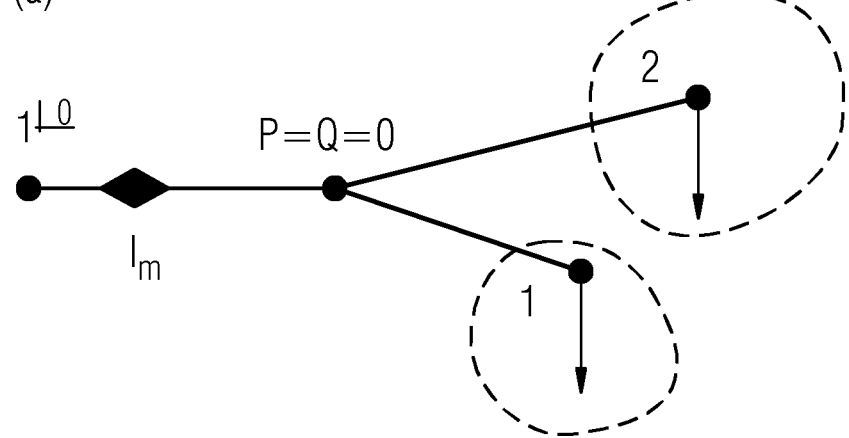
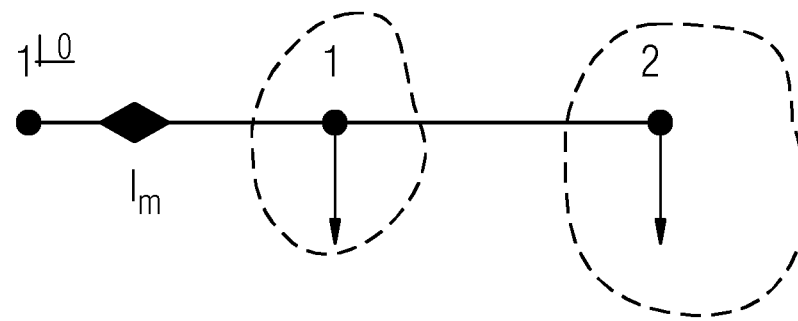

METHOD OF ESTIMATING A SYSTEM VALUE

The invention relates to a method of estimating a system value which indicates a state of an electrical distribution system, and a substation comprising a calculating unit configured to estimate a system value.

BACKGROUND

The notion of state estimation (SE) for transmission systems can be traced back to the seventies [1]. Some twenty years later, SE algorithms specifically tailored to distribution systems were introduced [2], [3]. In practice, however, it has not been until very recently that SE tools for distribution feeders have been comprehensively considered [4]-[6]. Smart grid developments are progressively bringing more and more information to Distribution Management Systems (DMS), allowing applications that were long ago conceptually mature but still waiting for the required infrastructure to be deployed at the distribution level [7], [8]. Eventually, the massively distributed nature of medium-voltage and low-voltage subsystems, and the resulting communication bottlenecks, will force utilities to consider some kind of hierarchical organization in today's fully centralized DMS [9]. Indeed, only if raw data are processed in a local manner [10] will it be possible for new and ubiquitous sources of information, such as smart meters and the associated concentrators, to be scanned at rates which are fast enough for real-time network operation. Until this partly decentralized environment arrives, DMS operators can only expect to have once-a-day or few-times-a-day values of energy consumed by customers connected to the distribution system [11]. This has motivated the development of heuristic methods combining load flow calculations [13], [14], machine learning functions [12] or pattern-based load allocation [15] with ad hoc SE techniques.

What these hybrid schemes generally have in common is a preprocessing phase in which delayed smart meter data or daily load patterns are somehow exploited to generate pseudomeasurements for the SE phase. In the foreseeable future, if not in the near term, smart meter data will be collected and preprocessed by substation-level management systems, at much faster scan rates than those achievable if every piece of information had to be gathered at the centralized DMS. Whereas a DMS is in charge of an entire system, typically serving several million customers, a 60-MW primary substation may serve three orders of magnitude less customers, whose smart meter data are in turn concentrated at less than a hundred intermediate points (generally secondary substations serving the LV subsystem). Having these data collected at the primary substation, at rates ranging from 5 to 20 times an hour, is a feasible choice even with today's bandwidths and technology.

In this context, the substation-level SE tool will have to deal with two heterogeneous types of information, as explained in more detail further below:

1) regular SCADA measurements, and eventually those coming from new smart grid sensors, captured every few seconds;

2) smart meter (or smart meter concentrator) readings and distributed generation production, updated every few minutes.

This naturally leads to an information processing model in two time scales. Even though two-time-scale problems have long been known and exploited in several engineering fields (see for instance [16]-[19]), including SE of chemical or biological processes [20], to the inventor's knowledge such a notion has not been explored so far in power system SE.

OBJECTIVE OF THE PRESENT INVENTION

An objective of the present invention is to provide a method of estimating a system value which indicates a state of an electrical distribution system, where the estimation needs to be based on measurement values with differing properties.

A further objective of the present invention is to provide a substation capable of estimating a system value which indicates a state of an electrical distribution system, where the estimation needs to be based on measurement values with differing properties.

BRIEF SUMMARY OF THE INVENTION

An embodiment of the invention relates to a method of estimating a system value which indicates a state of an electrical distribution system, the method comprising the steps of:
measuring one or more electrical quantities at a plurality of system nodes and providing measurement values, and
generating the system value based on the measurement values as well as on weighting coefficients that define or reflect the timely change rate of the measurement values and/or the transmission rate of the measurement values.

An advantage of this embodiment of the invention is that a fast and reliable state estimation can be carried out even if the measurement values belong to different time scales. For instance, the state estimation can be based on a combination of measurement values that include pseudomeasurement values as well as redundant measurement values, which are far more accurate.

The method preferably further comprises the steps of discriminating the measurement nodes into groups by the timely change rate of their measurement values and/or by their transmission rate of the measurement values. A weighting coefficient is preferably assigned to each group of said groups of measurement nodes depending on the timely change rate and/or the transmission rate of the measurement values of the respective group. The step of estimating the system value is preferably based on the weighted measurement values and the weighting coefficients.

Moreover the method may be used in distribution systems comprising a distribution feeder. The system value may then be estimated to define the electrical load connected to said distribution feeder.

Further, the system value may be estimated using a state estimation algorithm.

Moreover the system nodes may be discriminated into two groups, namely a first group comprising frequently available measurement values and a second group comprising less frequently available measurement values.

Furthermore, the system value may be estimated through iteratively solving the normal equation $$(H_p^T W_p H_p + H_m^T W_m H_m)\Delta x = H_p^T W_p [z_p - h_p(x)] + H_m^T W_m [z_m - h_m(x)]$$

wherein
$H_m$ designates a measurement matrix comprising the measurement values of the first group,
$H_m^T$ designates the transposed matrix of $H_m$, $H_p$ designates a measurement matrix comprising the measurement values of the second group, $H_m{}^T$ designates the transposed matrix of $H_p$, $W_m$ designates a weighting matrix comprising the weighting coefficient or coefficients assigned to the first group, $W_p$ designates a weighting matrix comprising the weighting coefficient or coefficients assigned to the second group, $\Delta x$ designates an increment vector of calculated values, $z_p$ designates a vector of measurement values assigned to the second group, $h_p(x)$ designates a vector of functions that defines measurements of the second group, $z_m$ designates a vector of measurement values assigned to the first group, and $h_m(x)$ designates a vector of functions that defines measurements of the first group.

The Cholesky factorization may be applied to the normal equations.

The weighting coefficients preferably define or at least reflect the information uncertainty of the corresponding measurement values.

Moreover the weighting coefficients preferably define or at least reflect the hierarchical position of the system nodes providing the measurement values.

The method as explained in an exemplary fashion above may be used in a distribution system comprising a medium voltage grid and a low voltage grid.

In the latter case, the measurement nodes may be discriminated into a first group and a second group. The first group may comprise the measurement values of the low voltage grid and the second group may comprise the measurement values of the medium voltage grid. One or more weighting coefficients may be assigned to the first group of measurement nodes, and one or more weighting coefficients may be assigned to the second group of measurement nodes. Then, the system value may be estimated based on the measurement values of the first and second group and the weighting coefficients of the first and second group.

The medium voltage grid and the low voltage grid are preferably separated by substation. In this case, said step of estimating the system value is preferably carried out in the substation.

A further embodiment of the present invention relates to a substation having a calculating unit configured to estimate a system value which indicates a state of an electrical distribution system, the calculating unit further being configured to carry out the steps of:
receiving measurement values indicating one or more electrical quantities from a plurality of system nodes, and
generating the system value based on the measurement values as well as on weighting coefficients that define or reflect the timely change rate of the measurement values and/or the transmission rate of the measurement values.

An advantage of this substation is that it may carry out a fast and reliable state estimation even if the measurement values belong to different time scales. For instance, the substation can handle a combination of measurement values that include pseudomeasurement values as well as redundant measurement values.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which in an exemplary fashion FIG. 2 shows generic scenarios illustrating an Ampere-measured branch with two pseudo-measured buses downstream, wherein in case a) each bus may represent the aggregated load of two main laterals downstream bifurcation, both of similar size and in case b) bus 1 can be a single load while bus 2 may represent the aggregated load of the remaining buses downstream.

DETAILED DESCRIPTION OF THE PREFERRED EMBODIMENT

Figure 1:
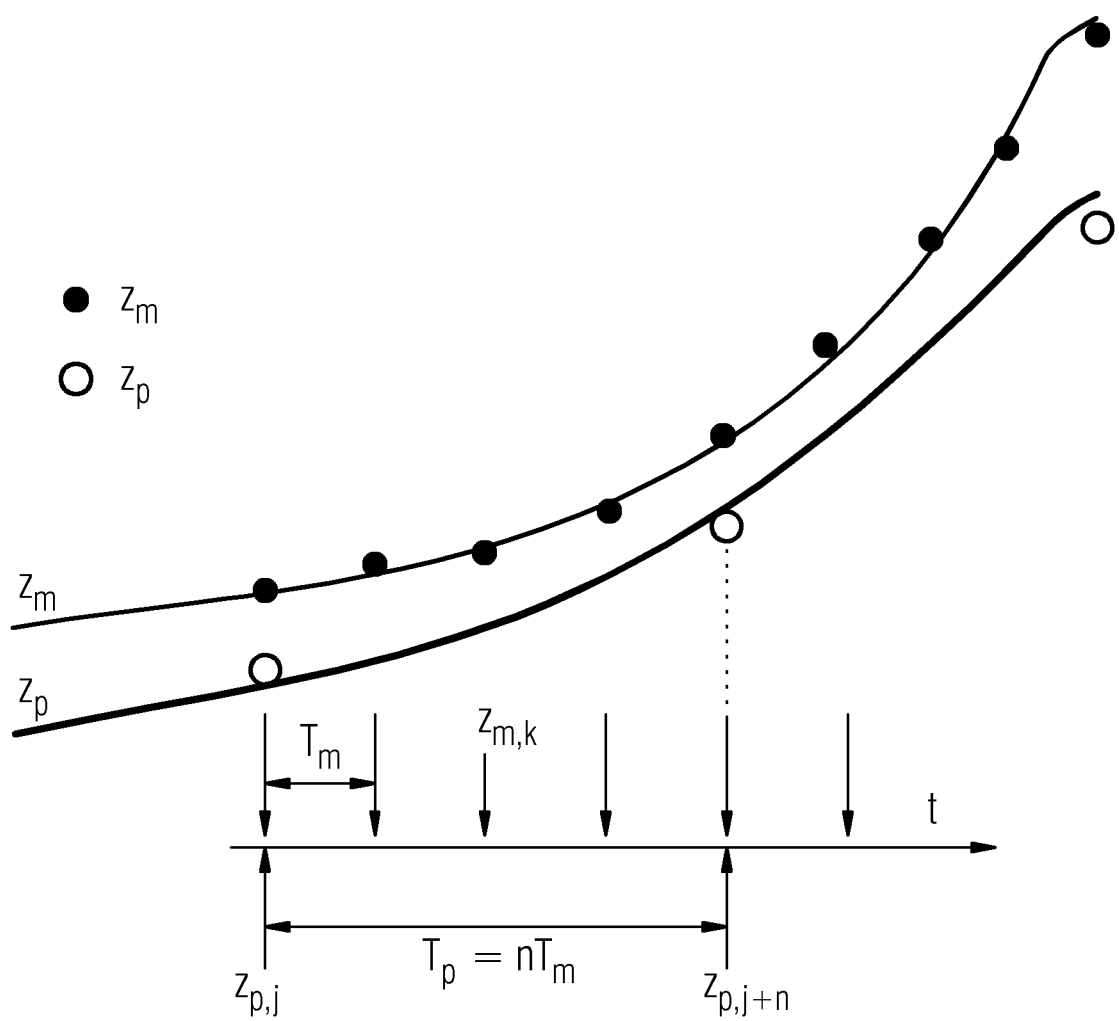
FIG. 1 shows fast measurement snapshots (designated by $z_m$) and slow pseudomeasurement snapshots (designated by $z_p$) of two electrical quantities, wherein the graphs designate the actual evolution and t designates the time.

The preferred embodiment of the present invention will be best understood by reference to the drawings, wherein identical or comparable parts are designated by the same reference signs throughout.

It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Sources of Information in Smart Distribution Systems

Unlike transmission and subtransmission systems, where real-time telemetry provides sufficient redundancy to assure network observability, Medium Voltage (MV) distribution feeders have so far lacked the required infrastructure (sensors and telecommunication) allowing the operating point to be accurately determined. In the upcoming smart grid paradigm, though, distribution systems will have to cope with a heterogeneous set of information sources, most of them not yet available at the DMS, which can be roughly classified into the following categories:

1. RTU measurements captured at High Voltage (HV)-MV substations, collected by the SCADA system of the DMS at rates ranging from few seconds to about a minute (in general, much lower refreshing rates than those employed at transmission-level SCADAs [22]). As far as radial feeders are concerned, such measurements typically reduce to the MV busbar voltage magnitude and head line currents (assuming passive loads with an average power factor, this allows the total P&{Q} delivered by the feeder to be computed). So far, this is essentially the only telemetered information at the MV level for a majority of utilities which, unless a fault occurs, can only have a very crude idea of what is going on downstream with the help of load allocation techniques (item 4).
2. Higher reliability standards (i.e. lower SAIFI/SAIDI indexes) are forcing distribution utilities to deploy more and more feeder automation devices, including remotely-operated intermediate switching points for fault management. Once the required communication channel is available, such points can be converted into true RTUs with very little extra investment. In fact, most vendors currently offer this product in their catalogues. The information provided by these additional RTUs can be useful for both fault location and state estimation purposes.
3. Distributed generation is already a reality and will increasingly spread in many radial feeders worldwide. Depending on the specific regulation and rated power, the production of DGs is required to be monitored at different rates, ranging from day-ahead hourly forecasting to real telemetry periodically submitted to the DMS.
4. Distribution utilities have customarily kept a more or less elaborated data base of historic load patterns/profiles. This information originates in several sources, including load forecasting, load allocation techniques in combination with feeder head measurements, characteristic power factor values of aggregated loads and systematic metering campaigns performed at specific points. The feeder-level state estimator can benefit from these not very precise values of P and Q, which can be used as pseudo-measurements to extend the observable area.

The latest and eventually most important addition to the list of information sources at the feeder level comes from the AMR/AMI infrastructure (typically smart meter concentrators), provided the right communication 'bridge' is built between AMI and DMS subsystems. Nowadays this information is collected once a day in many systems but, depending on bandwidth availability, snapshot latencies of up to 15 minutes have been reported.

Notice that not all of the above data will necessarily reach the DMS, but may remain at an intermediate place much closer to the points where they are captured from the field. In the hierarchical control system architecture envisioned elsewhere [procieee, smartsub, Bose], the right place where the raw information should be collected and processed is the distribution substation, since there are currently no technical barriers for a state estimator to be implemented in this environment. For the purposes of this work, all sources of information summarized above, to which the feeder-level state estimator can resort, will be grouped in two broad classes of different nature, each with different accuracy and latency:

Telemetered data provided by RTUs (items 1, 2 and, in some cases, 3). This comprises quite accurate snapshots captured with latencies ranging from few seconds to about a minute. The set of measurements is insufficient in any case to assure network observability.

Pseudomeasurements (items 3, 4 and 5). Updated at intervals ranging from 15 minutes to 24 hours, these bus-level data are barely critical for observability purposes.

Clearly, in order to achieve a minimum redundancy level, both information types should be properly combined, which leads to the particular SE model described in the sequel.

State Estimation with Two Time Scales

Let $z_m$ and $z_p$ denote the fast-rate measurement and slow-rate pseudomeasurement vectors, respectively. As suggested by FIG. 1, $z_m$ snapshots are updated at regular intervals of width $T_m$, while $z_p$ is refreshed at much wider intervals of period $T_p = n\, T_m$. Between two consecutive snapshots of $z_p$, n snapshots of $z_m$ are captured (n=4 in the FIG. 1).

At a given time instant, $t_k$, the available information is composed of the current snapshot $z_{m,k}$ and the past pseudomeasurement value $z_{p,j}$. Therefore, the faster the load increases or decreases the quicker and more obsolete $z_{p,j}$ becomes. When the sign of the slope does not change between $t_j$ and $t_{j+n}$, the worst condition in terms of pseudomeasurement obsolescence arises for $t_{j+n-1}$, just before $z_p$ is updated again. Dropping for simplicity the discrete-time indices, the resulting measurement model is:

$$\begin{bmatrix} z_p \\ z_m \end{bmatrix} = \begin{bmatrix} h_p(x) \\ h_m(x) \end{bmatrix} + \begin{bmatrix} \varepsilon_p \\ \varepsilon_m \end{bmatrix} \quad (1)$$

where $h_p(\cdot)$ and $h_m(\cdot)$ represent the respective measurement functions and $\varepsilon_p$ and $\varepsilon_m$ the associated errors. Notice that the variance of $\varepsilon_p$ is generally much higher than that of $\varepsilon_m$. The WLS SE solution is obtained by iteratively solving the normal equations:

$$(H_p^T W_p H_p + H_m^T W_m H_m)\Delta x = H_p^T W_p [z_p - h_p(x)] + H_m^T W_m [z_m - h_m(x)] \quad (2)$$

where the weighting coefficients should reflect whenever possible the information uncertainty:

$W_p^{-1} = \text{cov}(\varepsilon_p); W_m^{-1} = \text{cov}(\varepsilon_m)$

The special structure of the normal equations (2) can be exploited to save computational effort. Considering the relatively few number of measurements in vector $z_m$, a major source of computational saving arises when the Cholesky factorization of the gain matrix is not repeated at each SE run, but only when the set $z_p$ is updated. Approximating the gain matrix in this fashion may slightly increase the number of iterations, particularly when loads evolve quickly, but will not affect the solution as long as the right-hand side of (2) is exactly computed. Needless to say, using the solution of the previous run as starting point, rather than the customary flat start profile, is a convenient strategy to save iterations.

Limitations Arising from the Use of Reduced Redundancy Levels

This section is devoted to qualitatively analyzing the limitations of the two-scale state estimator (TSSE) in a context characterized by extremely low redundancy levels. Intuitively, one expects that adding a few branch Ampere measurements, scattered throughout the feeder, to the set of bus pseudomeasurements, will always improve the estimate of relevant quantities (bus voltage magnitudes and branch power flows), which is true so long as the feeder is taken as a whole. However, depending on whether or not all loads downstream have coincident evolution patterns, branch current measurements may or may not be helpful to improve the estimates of certain individual quantities when pseudomeasurements are not duly updated.

As explained below, this limitation stems from the combination of two adverse factors: 1) low redundancy of RTU measurements, clearly insufficient to render the network observable; 2) gradual obsolescence of barely critical pseudomeasurements as time elapses, of particular relevance in periods when bus injections change at a fast rate.

In order to illustrate the analysis it is sufficient to consider the two simplified radial feeders shown in FIG. 2. In both cases, in addition to the head bus voltage, there is an Ampere measurement at the branch which is closer to the feeder head, while only P&Q pseudomeasurements are available at the two buses downstream. Notice that, in spite of their simplicity, such reduced feeders can be representative, in equivalent form, of different realistic situations, by simply playing with the relative sizes of $P_1$-$Q_1$ and $P_2$-$Q_2$. For instance, in case (a) each bus may represent the aggregated load of two main laterals downstream a bifurcation, both of similar size. In case (b), bus 1 can be a single load while bus 2 may represent the aggregated load of the remaining buses downstream, etc. Instead of using an exact SE model, the same qualitative conclusions can be reached, with much less elaborated algebra, by adopting a lossless model with flat voltage profile in which active and reactive power injections constitute the state variables.

Given the latest pseudomeasurement values $P_1^m$-$Q_1^m$ and $P_2^m$-$Q_2^m$ and the most recent current measurement, $I_m$, which is assumed to be much more accurate than power pseudomeasurements, the WLS estimates for P1, P2, Q1 and Q2 can be analytically obtained. As shown in the Appendix, the active power estimates are:

$$\hat{P}_1 = P_1^m + \Delta P_1 \quad (3)$$
$$\hat{P}_2 = P_2^m + \Delta P_2$$

where $$\Delta P_1 = \frac{\omega_2}{\omega_1 + \omega_2}(K_m - 1)(P_1^m + P_2^m) \quad (4)$$

$$\Delta P_2 = \frac{\omega_1}{\omega_1 + \omega_2}(K_m - 1)(P_1^m + P_2^m)$$

$\omega_1$ and $\omega_2$ represent the weights of $P_1^m$ and $P_2^m$ respectively and $K_m$ is the ratio, $$K_m = \frac{I_m}{\sqrt{(P_1^m + P_2^m)^2 + (Q_1^m + Q_2^m)^2}} \quad (5)$$

Notice that $K_m > 1$ if the total load downstream has increased since slow-rate pseudomeasurements were updated, which is reflected in higher values of more recent $I_m$ snapshots, while $K_m < 1$ when the total load has decreased. Similar expressions are obtained for reactive powers by simply replacing P with Q (for this reason, only active powers will be paid attention to in the sequel).

In low-redundancy scenarios, like those considered in this work, the influence of the weighting coefficients $\omega_1$ and $\omega_2$ in the WLS estimates is crucial. In practice this poses a major problem, since knowing at each time instant the real uncertainty of pseudomeasurements is far from trivial. In this regard, it is worth considering the following two cases:

Same weights adopted ($\omega_2 = \omega_2$). This would lead to:

$$\Delta P_1 = \Delta P_2 = (K_m - 1)\frac{P_1^m + P_2^m}{2} \quad (6)$$

which means that both $P_1^m$ and $P_2^m$ will be corrected by the same amount to yield the respective estimates. In absence of any other information this will be acceptable provided both loads are of similar size. However, assume for instance that P1>>P2. Then, according to (6), even small changes in P1 might lead to relatively high deviations in the smaller load, P2, irrespective of whether this load has really changed or not.

Weights inversely proportional to the pseudomeasurement ($\omega_i = 1/P_i^m$). In this case, it is easy to see that:

$$\Delta P_i = (K_m - 1)P_i^m \Rightarrow \hat{P}_i = K_m P_i^m (i=1,2) \quad (7)$$

which means that each power will be corrected in proportion to its size. In other words, for low-redundancy scenarios, like the simplified ones represented in FIG. 2, the total load variation detected by an Ampere measurement at a given feeder section is prorated among the loads located downstream in proportion to their respective sizes.

Note that, irrespective of the weights adopted, the signs of both $\Delta P_1$ and $\Delta P_2$ will be the same, according to (4), as determined by the value of Km. If the total load increases (decreases) then Km>1 (Km<1) and both estimates, $\hat{P}_1$ and $\hat{P}_2$, will be higher (lower) than the outdated pseudomeasurements, $P_1^m$ and $P_2^m$. Indeed, this is an expected result for the low redundancy considered, since there is no way to know whether both loads have actually increased (decreased) or not (it is worth stressing that replacing Im by power flow measurements is not helpful in this regard).

Figure 3:
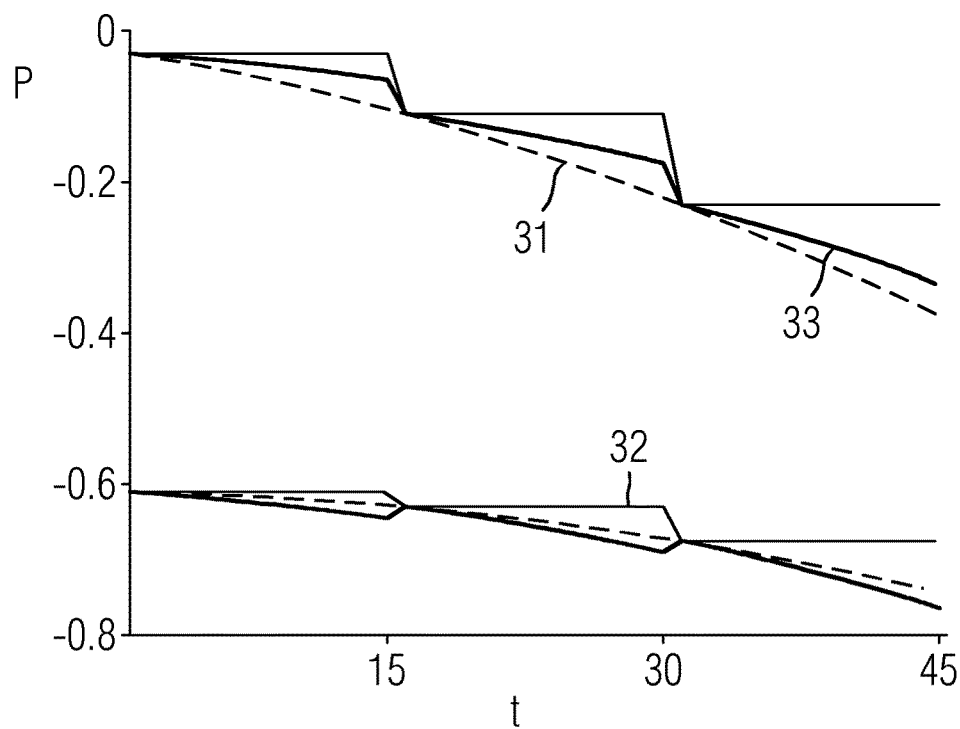
FIG. 3 shows an example with homogeneous load trends, wherein P designates the active power injection (p.u.), t designates the time in minutes, the upper set of lines designate bus 1, the lower set of lines designate bus 2, reference numeral 31 designates exact measurements, reference numeral 32 designates pseudomeasurements, reference numeral 33 designates 8 I measurements.

In feeder sections where all transformer loads downstream of an Ampere measurement evolve in an homogeneous way, which happens when most customers have similar patterns, this may not be a real limitation. However, in feeders comprising a mix of customers (residential, industrial, municipal, etc.) some transformer loads may be increasing while others are simultaneously decreasing, and combining few Ampere measurements with critical pseudomeasurements can be counterproductive, particularly if sudden load changes take place. FIG. 3 illustrates a case in which both P1 and P2 decrease during the next 45 minutes. The power estimates obtained when Im is incorporated (in this particular example w1=w2) approach the actual load evolution better than in absence of Im (stepwise solid grey line).

Figure 4:
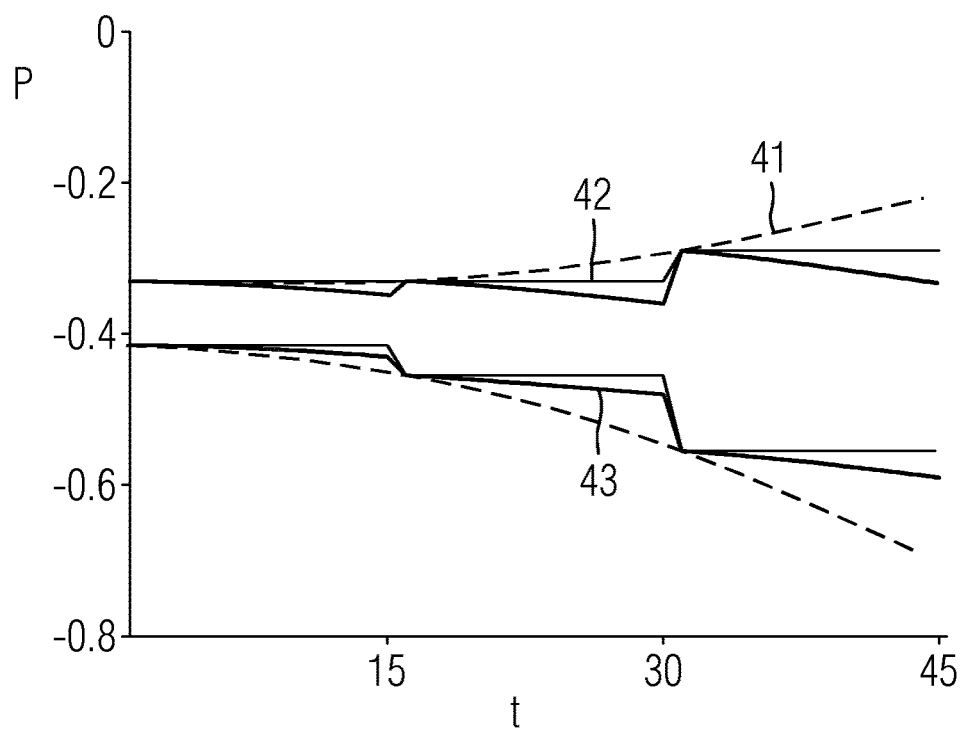
FIG. 4 shows an example with opposite load trends, wherein P designates the active power injection (p.u.), t designates the time in minutes, the upper set of lines designate bus 1, the lower set of lines designate bus 2, reference numeral 41 designates exact measurements, reference numeral 42 designates pseudomeasurements, reference numeral 43 designates 8 I measurements.

The case in which both loads evolve in opposite direction is shown in FIG. 4. In this case, note that, since the total aggregated load is decreasing, the addition of Im is beneficial for the load which is actually decreasing, P2, but detrimental to P1, whose increasing trend remains unnoticed when both loads are sensed upstream. From the point of view of the 'losing' load, P1, it would be preferable not to include Im in the model, since the persistent pseudomeasurement value (stepwise solid grey line) would better approximate the actual load evolution.

This somewhat counterintuitive conclusion (i.e., adding an accurate measurement can be counterproductive in certain cases) will be reaffirmed by the results presented below. Needless to mention, such limitations vanish when sufficient redundancy levels are achieved.

Solution Enhancements

So far it has been implicitly assumed that pseudomeasurements are only updated every n measurement snapshots. In other words, at time instant tk, the TSSE combines the current measurement snapshot, $z_{m,k}$, with a pseudomeasurement value, $z_{p,k}$, given by the latest available pseudomeasurement, $z_{p,k}=z_{p,j}$ k=j, . . . , j+n−1

Figure 5:
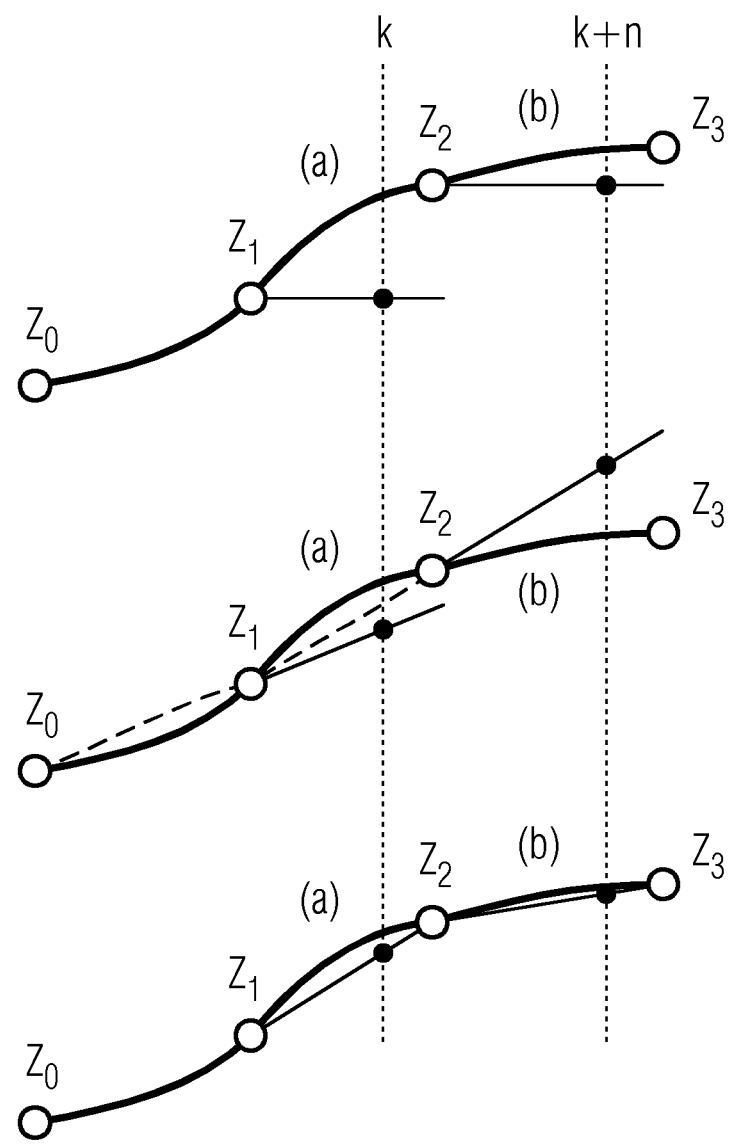
FIG. 5 shows the generation of pseudomeasurement intermediate values in a stepwise fashion (diagram at the top), in an extrapolation fashion (diagram in the middle) and in an interpolation fashion (diagram at the bottom)

This implies that pseudomeasurements are assumed to evolve in a stepwise fashion, as suggested by the uppermost diagram of FIG. 5.

Depending on whether future pseudomeasurement values are available in advance or not, other strategies to generate intermediate pseudomeasurement values are possible, as discussed below.

A. Pseudomeasurement Extrapolations

The accuracy of the estimates can be frequently improved if, instead of keeping the components of $z_p$ constant since the last update (stepwise evolution), their values are obtained by linear extrapolation from the last two samples (higher-order extrapolation is also possible, but the results are usually worse owing to longer transient periods). Mathematically, $$z_{p,k} = z_{p,j} + \frac{t_k + t_j}{T_p}(z_{p,j} - z_{p,j-1}) \quad k = j, \ldots, j+n-1$$

The middle diagram of FIG. 5 shows two consecutive intervals in which linear extrapolation behaves differently. At interval (a) the linearly extrapolated value approximates the actual evolution of the pseudo-measured quantity better than the latest available value, z1. At interval (b), however, owing to the sudden change of slope, linearly extrapolating the pseudomeasurement is worse than just keeping the previous value, z2. Linear extrapolation is helpful in a majority of cases to improve the estimation provided otherwise by the vanilla stepwise evolution. This happens when the time constants characterizing the load evolution are large enough compared with the refreshing rate of pseudomeasurements.

B. Pseudomeasurement Interpolations

Obtaining intermediate pseudomeasurements by extrapolation is the only choice when future information about the monitored quantity is missing. This is the case, for instance, of some distributed generators, usually burning fossil fuels, whose energy production is not forecasted but rather measured and collected at a relatively slow rate compared to regular SCADA measurements.

In practice, however, future pseudomeasurement values are almost always available, usually with decreasing accuracy as time elapses. For instance, the production of a wind generator for the next hour can be predicted with reasonable accuracy, and the same can be said of a PV farm. On the other hand, loads provided by service transformers can also be forecasted, usually within ±5% confidence intervals. In those cases, intermediate values can be easily obtained by linearly interpolating consecutive pseudomeasurements, as shown in the lower diagram of FIG. 5. Mathematically, $$z_{p,k} = z_{p,j} + \frac{t_k + t_j}{T_p}(z_{p,j+1} - z_{p,j}) \quad k = j, \ldots, j+n-1$$

Test Results

Figure 7:
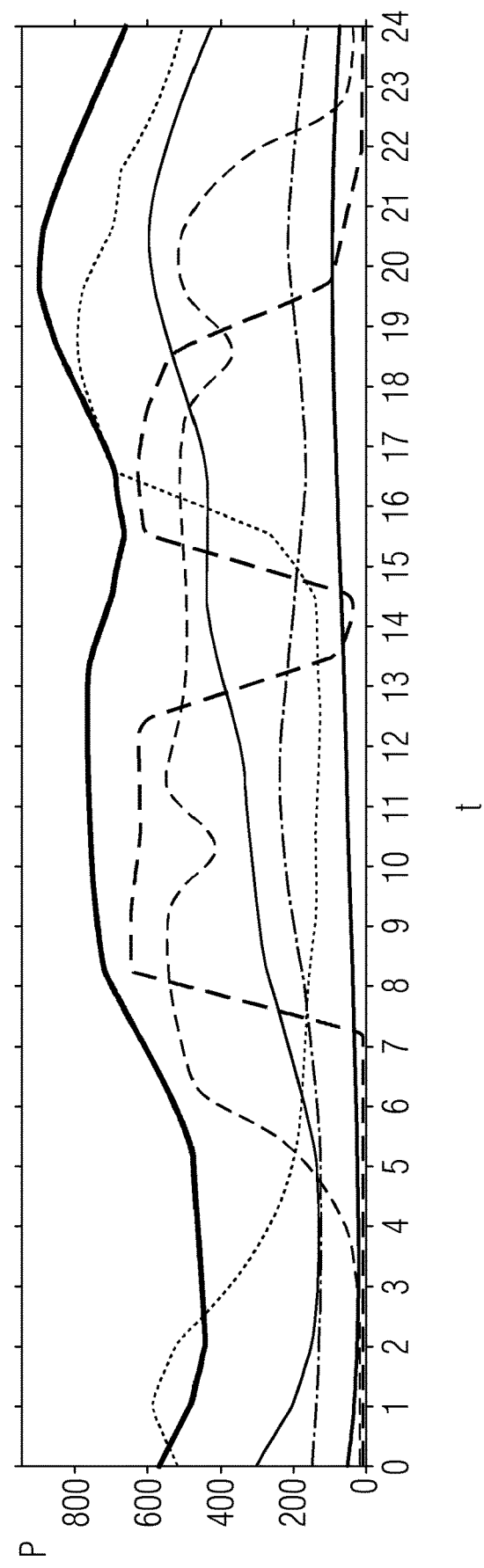
FIG. 7 shows examples of 24-hour heterogeneous load patterns, wherein P designates the active power in kW, t designates the time in hours.
Figure 8:
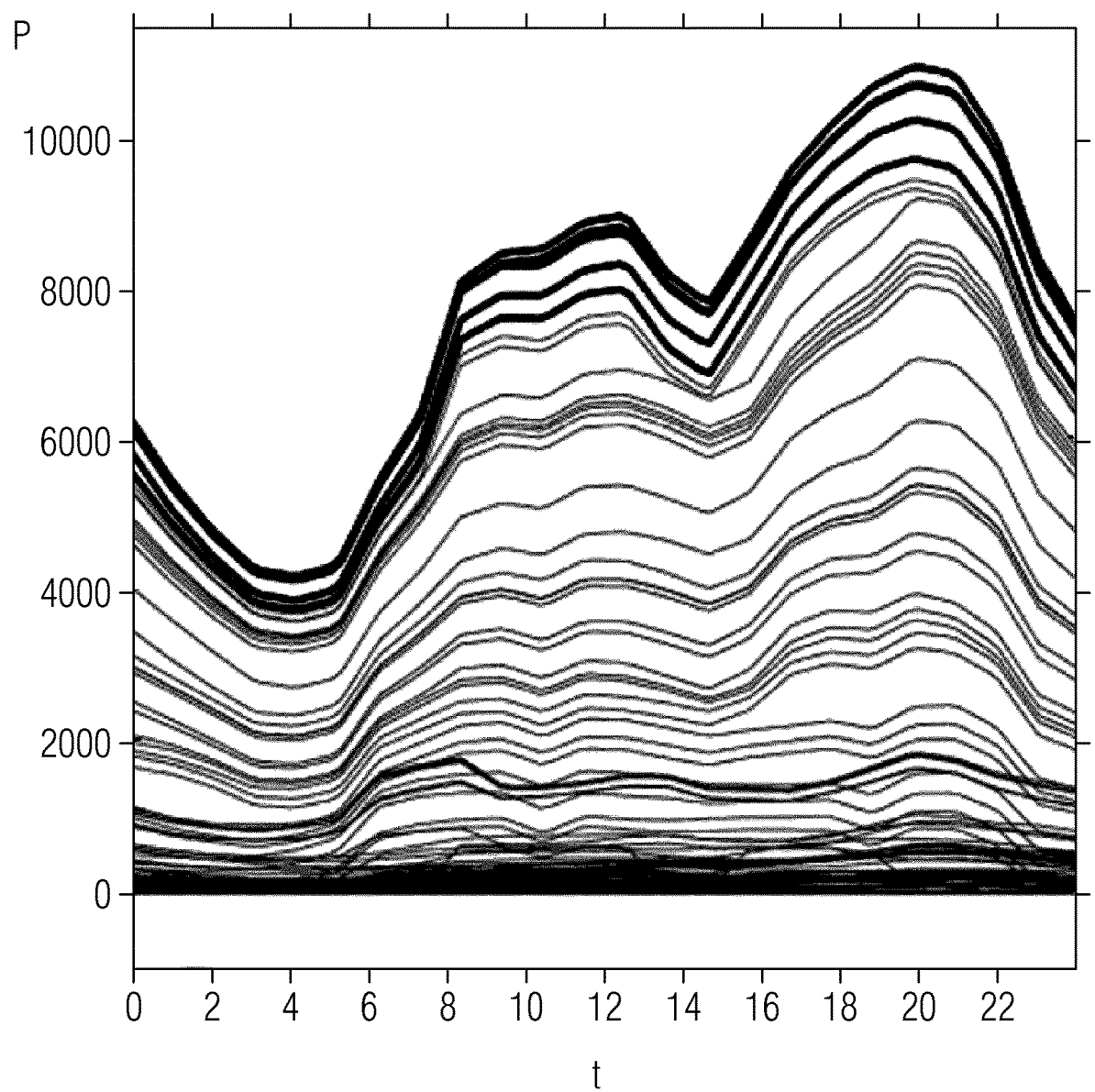
FIG. 8 shows branch active power flows in decreasing order, wherein P designates the active power in kW, t designates the time in hours, FIG. 9a)-c) shows an evolution of active power estimates at a typical load bus in scenario A, when $z_p$ is kept constant between snapshots (diagrams at the top), extrapolation is used (diagrams in the middle) and interpolation is used (diagrams at the bottom), wherein P designates the active power in kW, t designates the time in hours, reference numeral 91 designates exact measurements, reference numeral 92 designates pseudomeasurements, reference numeral 93 designates 8 I measurements.

The proposed TSSE model and solution refinements have been tested on a 15-kV, 100-bus distribution network (FIG. 6), made up of two feeders (11.8 and 8.7 km long) and 38 secondary transformers. This real system delivers energy to a mix of residential, industrial and commercial loads, comprising a heterogeneous set of load patterns, some of which are shown for illustrative purposes in FIG. 7. Twenty-four-hour active power consumptions are known at all nodes, while reactive powers are obtained by applying typical power factors for each customer type [15]. This leads to the branch power flow profiles shown in decreasing order in FIG. 8. In addition, the head voltage magnitude is assumed to be constant throughout the 24-hour period. This allows a load flow to be run, the results of which are considered as exact values for simulation purposes.

In order to generate realistic sets of measurements ($z_m$) and pseudomeasurements ($z_p$), random errors have been added to the exact 24-hour quantities provided by the load flow solution (except for the 38 zero-injection buses corresponding to the 15-kV side of secondary transformers). Each 24-hour error pattern is simulated by means of a sinusoidal wave of random amplitude and phase angle, spanning the 24-hour period, plus a random DC component, yielding together maximum peak errors of 10% for $z_p$ and 1% for $z_m$. Snapshots of sets $z_p$ and $z_m$ are then obtained by sampling the 24-hour noisy curves at intervals Tp=15 minutes and Tm=1 minute, respectively (n=15). In future smart grids n can be significantly reduced, particularly if smart meter information is processed in a distributed manner, while the number of measurements in $z_m$ will steadily increase as distribution automation devices proliferate.

Figure 6:
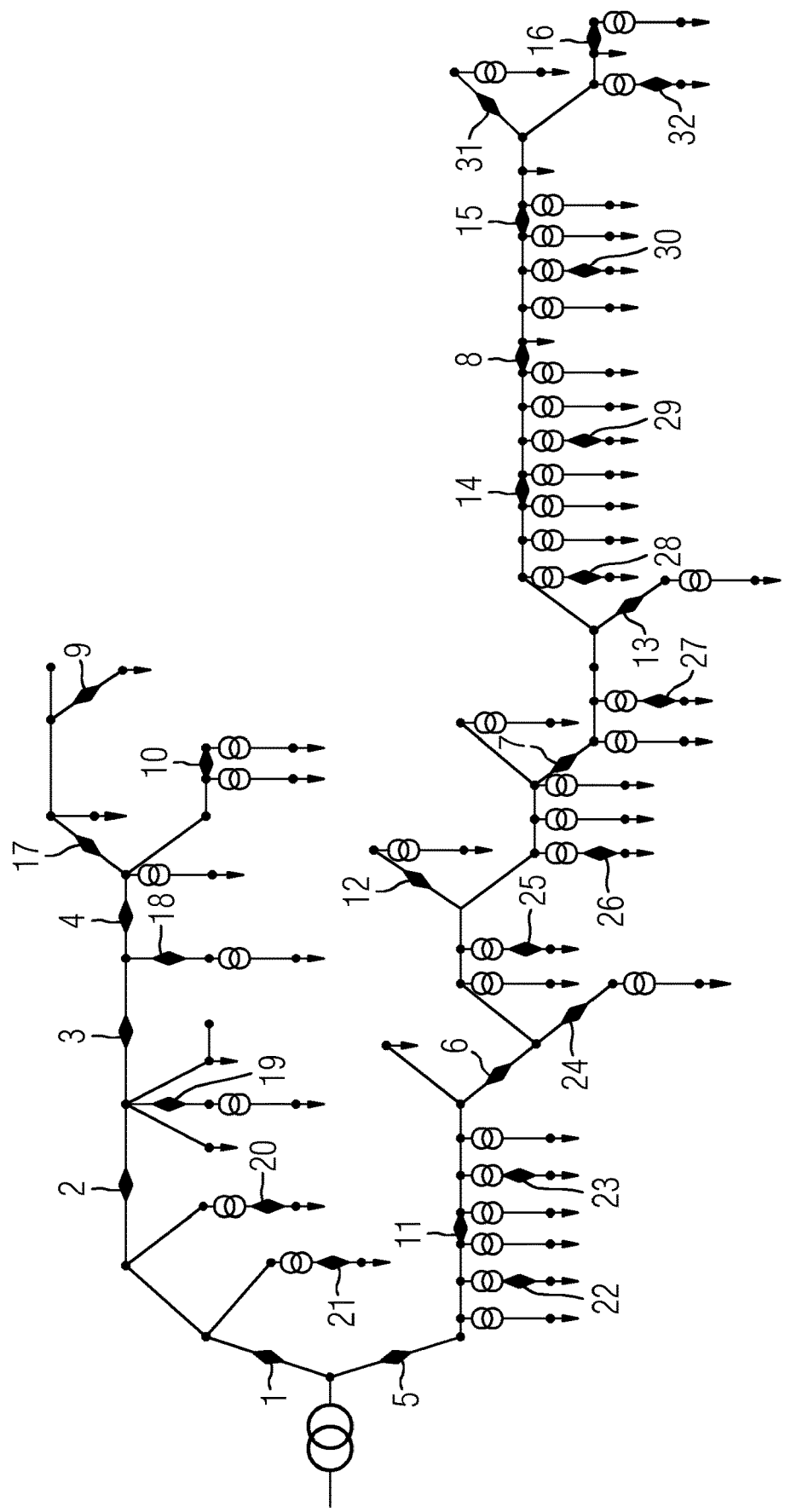
FIG. 6 shows a 100-bus, 15-kV test distribution network made up of two feeders and 38 secondary transformers, delivering energy to a mix of residential, industrial and commercial loads, comprising heterogeneous load patterns.

Pseudomeasurements in $z_p$ comprise active and reactive power injections at all buses where loads are connected to (zero-injection buses are handled as very accurate, constantly available measurements). In addition to the voltage magnitude at the head bus, fast-rate measurements ($z_m$) include sets of Ampere measurements, more or less uniformly distributed throughout the feeders. Three scenarios, labeled A, B, and C have been considered, including 8, 16 and 32 current measurements respectively, placed as shown in FIG. 6. Scenario A includes measurements numbered from 1 to 8 (4 of them in each feeder), scenario B measurements 1 to 16, and scenario C measurements 1 to 32, leading to really low redundancy levels (1.04, 1.08, and 1.16 respectively), in accordance anyway to what can be expected in future smart grids. The base-case scenario, in which only $z_p$ and the head bus voltage magnitude are available (i.e., without current measurements), has been also analyzed. This is simply a load flow solution using a critical set of erroneous data (no possibility of filtering errors), which will be useful to quantify the improvements brought about by the incorporation of $z_m$ in the different scenarios.

In real life, determining the accuracy of pseudomeasurements is not a trivial task. For this reason, in absence of better alternative criteria, weights adopted for the TSSE model have been set in inverse proportion to the pseudomeasurement and measurement values, and then those of $z_m$ are multiplied by 10 to reflect their higher accuracy compared with $z_p$. Simulations for the base case and the three barely redundant scenarios have been performed and the results obtained are compared with exact values. Solution enhancements described above (extrapolation and interpolation) have been also tested.

Figure 9:
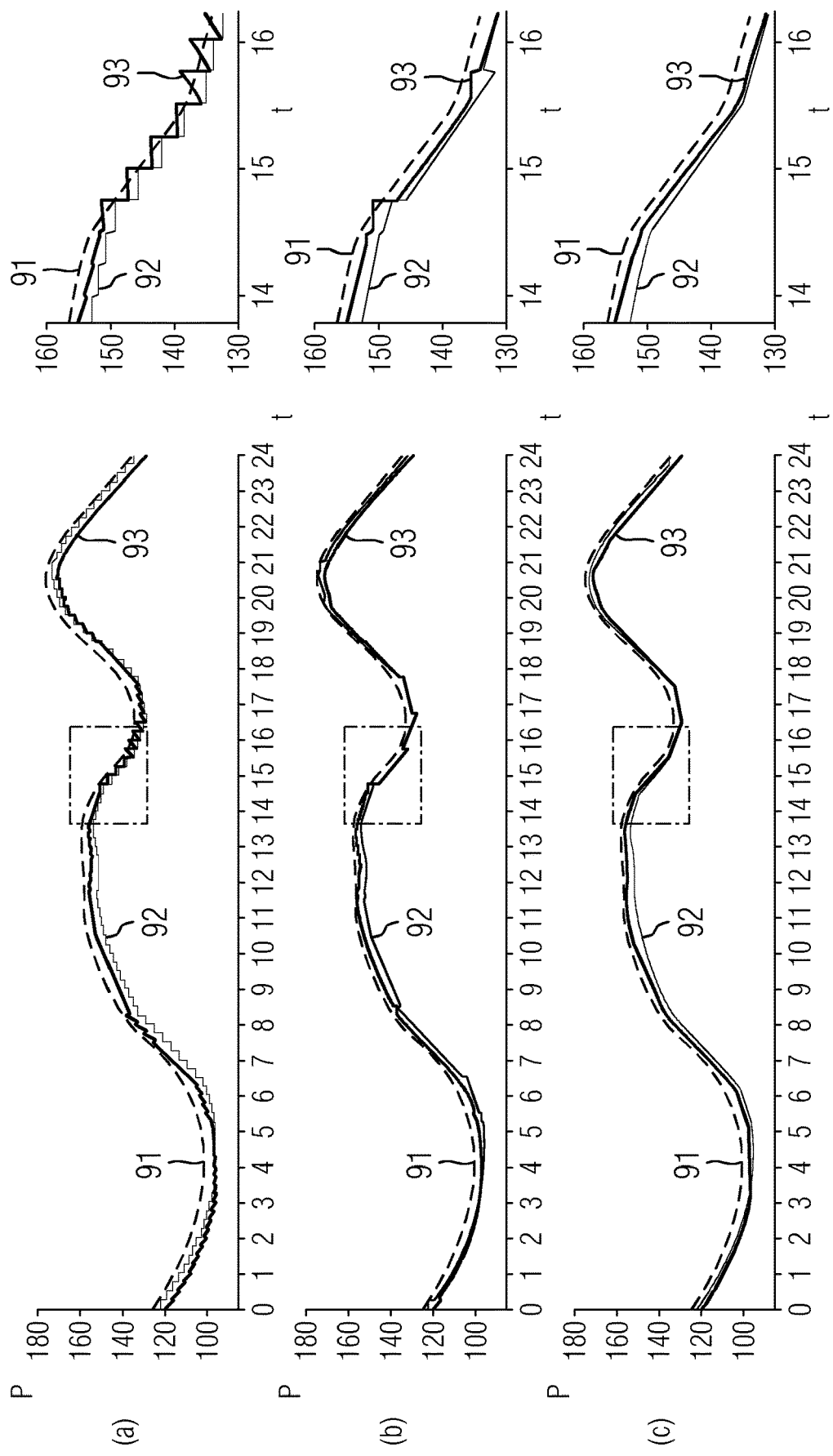

FIG. 9 shows the 24-hour evolution of active power at a representative load bus, for both the base case ($z_p$ only) and scenario A (8 branch measurements). Exact values are also provided for comparison. The diagrams on top show the results obtained when $z_p$ is kept constant between slow-rate snapshots (stepwise evolution assumed). In average, estimates obtained in scenario A are better than those of the base case, particularly at the central hours. The zoomed image on the right, corresponding to the interval 13:45 h-16:15 h, clearly shows the stepwise, and sometimes sawtooth shape evolution of estimates, according to the behavior theoretically predicted in above for very low redundancy levels and loads with opposite trends.

The central curves in FIG. 9 show the results obtained when extrapolation is applied to update future $z_p$ values before they are available. In this case, the evolution of estimates is smoother than in the previous one. However, when there is a sudden slope change, the estimator needs a time interval of width Tp to get adapted to the new load trend.

The bottom diagrams show the results when interpolation of $z_p$ is performed, which is possible only when future values are forecasted or somehow computed in advance. Compared to the two previous cases, this scheme clearly provides the best performance.

Similar conclusions apply to the rest of nodes. For this reason, since bus load and/or distributed generation forecasting is almost always available, considering the space limitations, the analysis of results will be restricted in the sequel to estimates obtained with interpolated $z_p$ data.

The accuracy of estimates in scenarios A, B, and C has been numerically compared with that of the base case. Average absolute values of errors (estimated minus exact) of power flow and voltage magnitude estimates (extended to all branches and nodes, respectively, for all minutes in 24 hours), are presented in the following table which lists average absolute errors with pseudomeasurement interpolation:

|  | Scenario | | | |
| --- | --- | --- | --- | --- |
|  | Base Case | A | B | C |
| Redundancy | 1 | 1.04 | 1.08 | 1.16 |
| $P_{ij}$ (kW) | 8.34 | 4.80 | 4.45 | 3.86 |

-continued

|  | Scenario | | | |
| --- | --- | --- | --- | --- |
|  | Base Case | A | B | C |
| $Q_{ij}$ (kvar) | 4.47 | 3.28 | 3.01 | 2.85 |
| $V_i$ (p.u.)*$10^{-3}$ | 0.16 | 0.11 | 0.10 | 0.08 |

Clearly, as the number of current measurements increases, the average errors decrease. It is worth noting, however, that the larger relative improvement with respect to the base case is obtained with scenario A, comprising just 8 current measurements.

Since adding more real-time measurements has a significant associated cost, each user of the TSSE should determine at the planning stage how many extra measurements are required to achieve the desired accuracy, for given sampling rates, pseudomeasurement quality and diversity of load evolution. If all loads have very homogeneous trends, as happens for instance when the feeders cover a purely residential area, then perhaps one or two Ampere measurements (at the head and middle of the feeder), might suffice to complement forecasted load values (in the limit this reduces to a simple load allocation scheme). However, as happens in the distribution system tested herein, if there is a mix of load types, some of them raising when others are decreasing, then it is not so obvious what is the optimal number and placement of real-time measurements (this constitutes an interesting optimization problem).

Figure 10:
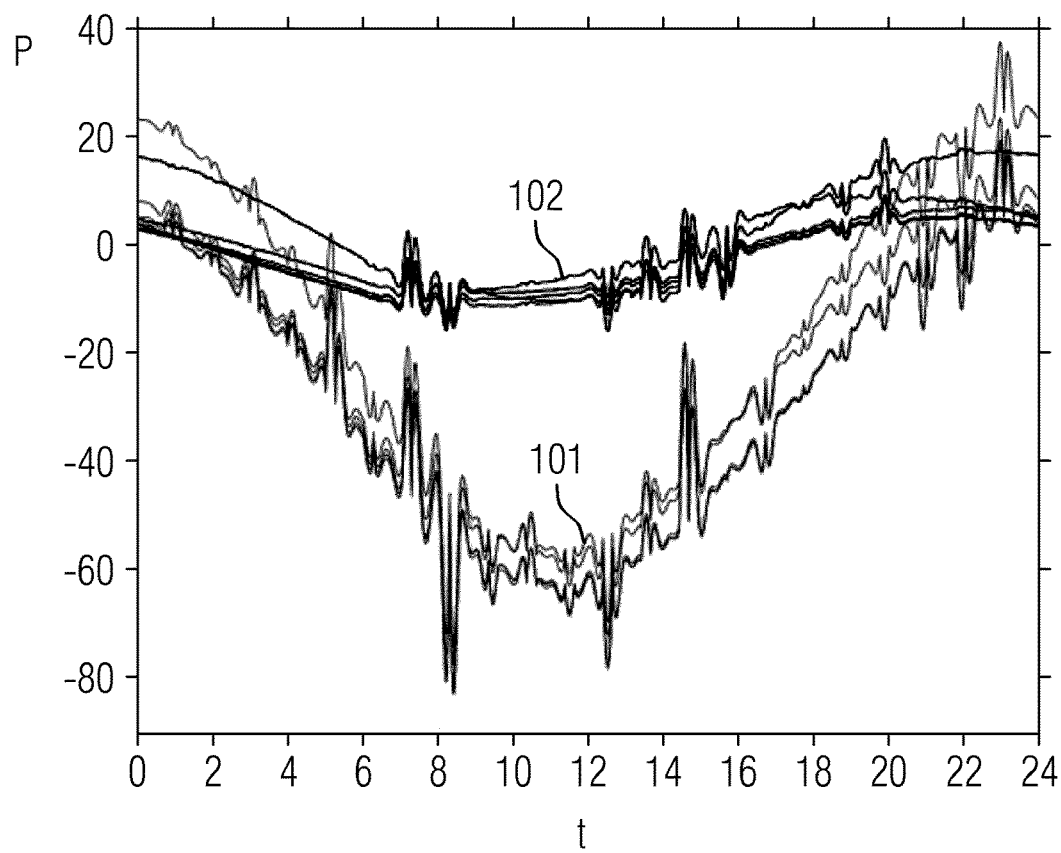
FIG. 10 shows an evolution of active power flow errors for the 5 branches with the largest load, wherein P designates the active power error in kW, t designates the time in hours, reference numeral 101 designates pseudomeasurements, reference numeral 102 designates 8 I measurements.

The improvement brought about by the addition of 8 current measurements is better visualized in FIG. 10, representing the 24-hour evolution of active power flow errors corresponding to the 5 branch sections carrying the largest apparent power (shown in boldface in FIG. 8), both for the base case and scenario A. In the central hours, negative errors exceeding 60 kW can be noticed for the base case, while errors arising with 8 real-time measurements are lower than 20 kW and clearly closer to zero in average. It is worth pointing out that, as theoretically predicted, error peaks (both positive and negative, of up to −80 kW in the base case) take place when there are sudden slope changes in the load evolution, which happens approximately at 5:30, 7:20, 8:20, 12:30 and 14:30 hours (the reader is referred to the quickly changing load patterns of FIG. 7).

Figure 11:
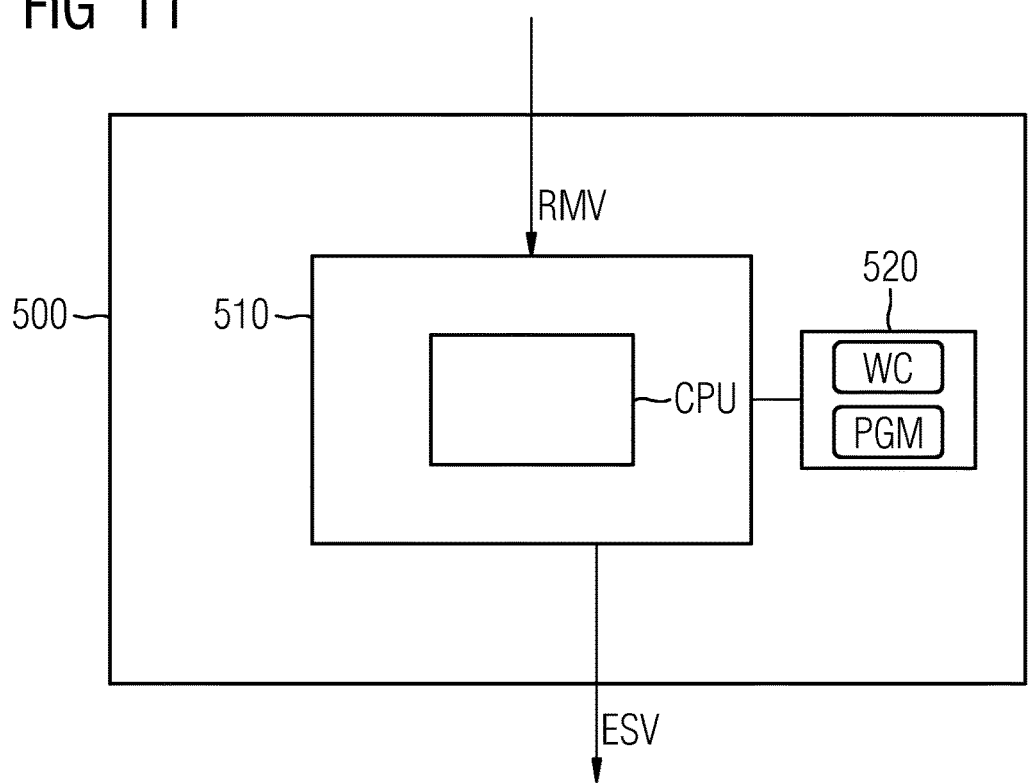
FIG. 11 shows an exemplary embodiment of a substation according to the present invention.

FIG. 11 shows an embodiment of a substation 500. The substation 500 comprises a calculating unit 510. The calculating unit 510 is configured to estimate a system value ESV which indicates a state of an electrical distribution system. The substation 500 further comprises a memory 520, which stores weighting coefficients WC that define or reflect the timely change rate of the measurement values RMV and/or the transmission rate of the measurement values RMV.

The calculating unit 510 comprises a computing unit CPU which is programmed to carry out the steps of receiving the measurement values RMV which indicates one or more electrical quantities from a plurality of system nodes, and generating the system value ESV based on the measurement values RMV as well as on the weighting coefficients WC. The program PGM that defines the processing of the computing unit CPU may be stored in the memory 520.

CONCLUSION

Based on an analysis (types, latencies and accuracy) of the information sources available at the distribution level, a state estimator in two time scales is proposed in this paper. It integrates a critical set of pseudomeasurements with very few redundant measurements, more accurate and captured n times faster. Limitations of the proposed model arising in low-redundancy environments, particularly when heterogenous load patterns coexist in the same feeder, are discussed, and several enhancements to deal with pseudomeasurement obsolescence are proposed.

Test results on a real distribution system, feeding a diversity of load patterns, fully confirms the suitability of the TSSE to both improve the accuracy and increase the latency of the load flow solutions that could otherwise be computed if only pseudomeasurements were used. In the midterm, forecasted pseudomeasurements will be gradually replaced by smart meter readings and the number of measurements will steadily increase, but the need to handle two time scales will persist.

APPENDIX

In the simple networks of FIG. 2, the measurement model comprises two pairs of power pseudomeasurements:

$$\left. \begin{array}{l} P_1^m = P_1 + \varepsilon_{P_1} \\ P_2^m = P_2 + \varepsilon_{P_2} \\ Q_1^m = Q_1 + \varepsilon_{Q_1} \\ Q_2^m = Q_2 + \varepsilon_{Q_2} \end{array} \right\} \rightarrow z_1 = x + \varepsilon \quad (8)$$

plus an Ampere measurement which, being much more accurate than the set of power pseudomeasurements, can be considered for our purposes as an equality constraint. Ignoring branch losses, with Vi=1, it can be approximately expressed as follows:

$$I_m^2 = (P_1+P_2)^2 + (Q_1+Q_2)^2 \rightarrow z_2 = s(x) \quad (9)$$

In compact form, the objective function associated with the equality-constrained WLS SE can be written as:

$$l = \frac{1}{2}(z_1-x)^T W(z_1-x) - \lambda^T [z_2-s(x)] \quad (10)$$

with x given by:

$$x = [P_1, P_2, Q_1, Q_2]^T \quad (11)$$

The estimate, $\hat{x}$, is the one satisfying the first-order optimality conditions:

$$W(z_1 - \hat{x}) - S^T \lambda = 0 \quad (12)$$

$$z_2 - s(\hat{x}) = 0 \quad (13)$$

Assuming the weighting coefficients of P and Q are the same, (12) can be rewritten as:

$$\hat{P}_1 = P_1^m - 2\omega_1^{-1}(\hat{P}_1 + \hat{P}_2)\lambda \quad (14)$$

$$\hat{P}_2 = P_2^m - 2\omega_2^{-1}(\hat{P}_1 + \hat{P}_2)\lambda \quad (15)$$

$$\hat{Q}_1 = Q_1^m - 2\omega_1^{-1}(\hat{Q}_1 + \hat{Q}_2)\lambda \quad (16)$$

$$\hat{Q}_2 = Q_2^m - 2\omega_2^{-1}(\hat{Q}_1 + \hat{Q}_2)\lambda \quad (17)$$

Adding (14) to (15) and (16) to (17) yields:

$$\hat{P}_1 + \hat{P}_2 = \frac{(P_1^m + P_2^m)}{1 + 2\lambda(\omega_1^{-1} + \omega_2^{-1})} \quad (18)$$

-continued $$\hat{Q}_1 + \hat{Q}_2 = \frac{(Q_1^m + Q_2^m)}{1 + 2\lambda(\omega_1^{-1} + \omega_2^{-1})} \quad (19)$$

Substituting (18) and (19) into (9):

$$I_m^2 = \frac{(P_1^m + P_2^m)^2 + (Q_1^m + Q_2^m)^2}{[1 + 2\lambda(\omega_1^{-1} + \omega_2^{-1})]^2} \quad (20)$$

Let us define Km as:

$$K_m = \frac{1}{1 + 2\lambda(\omega_1^{-1} + \omega_2^{-1})} \quad (21)$$

Then, $$K_m^2 = \frac{I_m^2}{(P_1^m + P_2^m) + (Q_1^m + Q_2^m)^2} \quad (22)$$

which allows rewriting (18) and (19) as:

$$\hat{P}_1 + \hat{P}_2 = K_m(P_1^m + P_2^m) \quad (23)$$

$$\hat{Q}_1 + \hat{Q}_2 = K_m(Q_1^m + Q_2^m) \quad (24)$$

Going back (14)-(15), they can be written in matrix form as (same for $\hat{Q}_i$ and $Q_i^m$):

$$\begin{bmatrix} \omega_1 + 2\lambda & 2\lambda \\ 2\lambda & \omega_2 + 2\lambda \end{bmatrix} \begin{bmatrix} \hat{P}_1 \\ \hat{P}_2 \end{bmatrix} = \begin{bmatrix} \omega_1 P_1^m \\ \omega_2 P_2^m \end{bmatrix} \quad (25)$$

and, explicitly computing the inverse:

$$\begin{bmatrix} \hat{P}_1 \\ \hat{P}_2 \end{bmatrix} = \frac{1}{\omega_1 + \omega_2} \begin{bmatrix} \omega_1 + \omega_2 K_m & (K_m - 1)\omega_2 \\ (K_m - 1)\omega_1 & \omega_2 + \omega_1 K_m \end{bmatrix} \begin{bmatrix} P_1^m \\ P_2^m \end{bmatrix} \quad (26)$$

REFERENCES

[1] F. C. Schweppe, J. Wildes, D. B. Rom, "Power system static state estimation, Part I, II, III", IEEE Trans. Power Apparat. Syst., Vol. PAS-89, No. 1, pp. 120-135, January 1970.

[2] I. Roytelman, S. M. Shahidehpour, "State estimation for electric power distribution systems in quasi real-time conditions," IEEE Trans. on Power Delivery, vol. 8, no. 4, pp. 2009-2015, October 1993.

[3] C. N. Lu, J. H. Teng, W.-H. E. Liu, "Distribution state estimation", IEEE Transactions on Power Systems, vol. 10, no. 1, pp. 229-240, February 1995.

[4] R. Hoffman, S. Lefebvre, J. Prevost, "Distribution State Estimation: A Fundamental Requirement for the Smart Grid", DistribuTECH (2010).

[5] I. Dzafic, S. Henselmeyer, H. T. Neisius, "Real-time Distribution System State Estimation," IPEC, 2010 Conference Proceedings, pp. 22-27, October 2010.

[6] I. Dzafic, M. Gilles, R. A. Jabr, B. C. Pal and S. Henselmeyer, "Real Time Estimation of Loads in Radial and Unsymmetrical Three-Phase Distribution Networks," IEEE Trans. on Power Systems, vol. 28, No. 4, pp. 4839-4848, November 2013.
[7] A. Bose, "Smart Transmission Grid Applications and Their Supporting Infrastructure," IEEE Trans. on Smart Grid, vol. 1, no. 1, pp. 11-19, June 2010.
[8] S. T. Mak, N. Farah, "Synchronizing SCADA and Smart Meters Operation For Advanced Smart Distribution Grid Applications", IEEE PES Innovative Smart Grid Technologies, 2012.
[9] A. Gomez-Exposito, A. Abur, A. de la Villa Jaen, C. Gomez-Quiles "A Multilevel State Estimation Paradigm for Smart Grids, Proceeedings of the IEEE, vol. 99, No. 6, pp. 952-976, June 2011.
[10] C. Gomez-Quiles, A. Gomez-Exposito and A. de la Villa Jaen, "State Estimation for Smart Distribution Substations," IEEE Trans. on Smart Grid, vol. 3, no. 2, pp. 986-995, June 2012.
[11] K. Samarakoon, J. Wu, J. Ekanayake, N. Jenkins, "Use of Delayed Smart Meter Measurements for Distribution State Estimation", IEEE Power and Energy Society General Meeting, July 2011.
[12] J. Wu, Y. He and N. Jenkins, "A Robust State Estimator for Medium Voltage Distribution Networks", IEEE Trans. on Power Systems, vol. 28, No. 2, pp. 1008-1016, May 2013.
[13] A. Abdel-Majeed, S. Tenbohlen, D. Schollhorn and M. Braun, "Development of State Estimator for Low Voltage Networks using Smart Meters Measurement Data", Powertech 2013, Grenoble.
[14] X. Feng, F. Yang and W. Peterson, "A Practical Multi-Phase Distribution State Estimation Solution Incorporating Smart Meter and Sensor Data", IEE/PES General Meeting, San Diego 2012.
[15] Carmona, C.; Romero-Ramos, E.; Riquelme, J.; "Fast and reliable distribution load and state estimator," Electric Power System Research, Vol. 101, pp. 110-124, August 2013.
[16] Chow, J.; Kokotovic, P. V., "Two-time-scale feedback design of a class of nonlinear systems," IEEE Trans. on Automatic Control, vol. 23, No. 3, pp. 438-443, June 1978.
[17] Khorasani, K.; Pai, M. A., "Two time scale decomposition and stability analysis of power systems," IEE Proceedings D: Control Theory and Applications, vol. 135, No. 3, pp. 205-212, May 1988.
[18] Hofmann, H.; Sanders, S. R., "Speed-sensorless vector torque control of induction machines using a two-time-scale approach," IEEE Trans. on Industry Applications, vol. 34, no. 1, pp. 169-177, January/February 1998.
[19] Yin, G.; Qing Zhang; Moore, J. B.; Yuan Jin Liu, "Continuous-time tracking algorithms involving two-time-scale Markov chains," IEEE Trans. on Signal Processing, vol. 53, no. 12, pp. 4442-4452, December 2005.
[20] Nagy-Kiss, A. M.; Marx, B.; Mourot, G.; Schutz, G.; Ragot, J., "State estimation of two-time scale multiple models with unmeasurable premise variables. Application to biological reactors," 49th IEEE Conference on Decision and Control (CDC), pp. 5689-5694, December 2010.
[21] R. Singh, B. C. Pal, R. A. Jabr, "Choice of estimator for distribution system state estimation", IET Gener. Transm. Distrib., Vol. 3, No. 7, pp. 666-678, 2009.
[22] P. Kansal, A. Bose, "Bandwidth and Latency Requirements for Smart Transmission Grid Applications," IEEE Trans. on Smart Grid, vol. 3 No. 3, pp. 1344-1351, September 2012.

The invention claimed is:

1. A method of estimating a system value indicating a state of an electrical distribution system, the method comprises the steps of:
measuring at least one electrical quantity at a plurality of system nodes and generating measurement values;
discriminating the plurality of system nodes into at least two groups including a first group having frequently available measurement values and a second group having less frequently available measurement values; and
generating, at a substation, the system value based on the measurement values of the first group, the measurement values of the second group, and weighting coefficients that define or reflect at least one property selected from the group consisting of a timely change rate of the measurement values of the first group and the measurement values of the second group and a transmission rate of the measurement values of the first group and the measurement values of the second group;
wherein the electrical distribution system includes a medium voltage grid and a low voltage grid; and
wherein the first group includes the measurement values of the low voltage grid and the second group includes the measurement values of the medium voltage grid, wherein at least one of the weighting coefficients is assigned to the first group of the plurality of system nodes, wherein at least one of the weighting coefficients is assigned to the second group of the plurality of system nodes, and the system value is estimated based on the measurement values of the first and second groups and the weighting coefficients of the first and second groups.

2. The method according to claim 1, which further comprises:
discriminating the plurality of system nodes into the groups by the timely change rate of the measurement values associated with the plurality of system nodes and/or by the transmission rate of the measurement values associated with the plurality of system nodes;
assigning a weighting coefficient to each group of the groups of the plurality of system nodes depending on the timely change rate and/or the transmission rate of the measurement values of the group; and
estimating the system value based on weighted measurement values and the weighting coefficients.

3. The method according to claim 1, wherein the electrical distribution system has a distribution feeder, and the system value is estimated to define an electrical load connected to distribution feeder.

4. The method according to claim 1, which further comprises estimating the system value using a state estimation algorithm.

5. The method according to claim 1, which further comprises:
estimating the system value through iteratively solving a normal equation $$(H_p^T W_p H_p + H_m^T W_m H_m)\Delta x = H_p^T W_p [z_p - h_p(x)] + H_m^T W_m [z_m - h_m(x)]$$

wherein $H_m$ designates a measurement matrix having the measurement values of the first group, $H_m^T$ designates a transposed matrix of $H_m$, $H_p$ designates a measurement matrix having the measurement values of the second group, $H_p^T$ designates a transposed matrix of $H_p$, $W_m$ designates a weighting matrix containing the weighting coefficient or coefficients assigned to the first group, $W_p$ designates a weighting matrix having the weighting coefficient or coefficients assigned to the second group, Δx designates an increment vector of calculated values, $z_p$ designates a vector of the measurement values assigned to the second group, $h_p$ (x) designates a vector of functions that defines measurements of the second group, $z_m$ designates a vector of the measurement values assigned to the first group, and $h_m$ (x) designates a vector of functions that defines measurements of the first group.

6. The method according to claim 5, which further comprises applying Cholesky factorization to the normal equation of claim 5.

7. The method according to claim 1, wherein the weighting coefficients define or at least reflect an information uncertainty of corresponding measurement values.

8. The method according to claim 1, wherein the weighting coefficients define or at least reflect a hierarchical position of the system nodes providing the measurement values.

9. The method according to claim 1, wherein a substation separates the medium voltage grid from the low voltage grid.

10. The method according to claim 9, wherein the step of estimating the system value is carried out in a substation.

11. A substation, comprising:
a calculating unit configured to estimate a system value which indicates a state of an electrical distribution system, said calculating unit configured to carry out the steps of:
receiving measurement values indicating at least one electrical quantity from a plurality of system nodes;
discriminating the plurality of system nodes into at least two groups including a first group having frequently available measurement values and a second group having less frequently available measurement values; and
generating, at a substation, the system value based on the measurement values of the first group, the measurement values of the second group, and weighting coefficients that define or reflect at least one property selected from the group consisting of a timely change rate of the measurement values of the first group and the measurement values of the second group and a transmission rate of the measurement values of the first group and the measurement values of the second group;
wherein the electrical distribution system includes a medium voltage grid and a low voltage grid; and
wherein the first group includes the measurement values of the low voltage grid and the second group includes the measurement values of the medium voltage grid, wherein at least one of the weighting coefficients is assigned to the first group of the plurality of system nodes, wherein at least one of the weighting coefficients is assigned to the second group of the plurality of system nodes, and the system value is estimated based on the measurement values of the first and second groups and the weighting coefficients of the first and second groups.

* * * * *